United States Patent [19]

Sato et al.

[11] Patent Number: 5,194,459

[45] Date of Patent: Mar. 16, 1993

[54] FLUOROPOLYMER INSULATING MATERIAL CONTAINING HOLLOW MICROSPHERES

[75] Inventors: Yoshiaki Sato, Saitama; Sakuko Kaneda, Tokyo, both of Japan

[73] Assignee: Junkosha Co., Ltd., Tokyo, Japan

[21] Appl. No.: 650,335

[22] Filed: Feb. 4, 1991

[30] Foreign Application Priority Data

Feb. 5, 1990 [JP] Japan .................................... 2-24445

[51] Int. Cl.$^5$ ............................................... C08J 9/32
[52] U.S. Cl. ...................................... 523/219; 521/54; 521/57; 521/76; 521/145; 428/313.3; 523/218
[58] Field of Search ................ 523/219, 218; 521/145, 521/54, 57, 76; 428/313.3

[56] References Cited

U.S. PATENT DOCUMENTS

| | | | |
|---|---|---|---|
| 2,806,509 | 1/1983 | Bozzacco et al. | 154/28 |
| 4,368,828 | 1/1983 | Samuel et al. | 523/219 |
| 4,900,617 | 2/1990 | Smith | 523/219 |

*Primary Examiner*—Morton Foelak
*Attorney, Agent, or Firm*—Gary A. Samuels

[57] ABSTRACT

An insulating material formed from a network of hollow gas-filled microspheres embedded in a cured three-dimensional cross-linked polymer network of copolymerized unsaturated fluorinated monomers and acrylic monomers reacted in a fluorinated organic solvent.

11 Claims, No Drawings

FLUOROPOLYMER INSULATING MATERIAL CONTAINING HOLLOW MICROSPHERES

FIELD OF THE INVENTION

The present invention pertains to fluorocarbon polymer insulating materials having improved electrical properties by means of their hollow microsphere content.

BACKGROUND OF THE INVENTION

Fluorine-containing polymers have been widely used as electrically insulating materials owing to the fact that they possess excellent electrical characteristics, such as typically having a low dielectric constant as compared to other polymers and having a small dielectric loss tangent. Moreover, foaming of the polymers has been studied in order to further improve electrical characteristics.

Numerous methods have been proposed for obtaining fluorine-containing polymer foams. Known examples include a method wherein organic or inorganic chemicals are added to a polymer and foaming is brought about by gases. Primarily inert gases such as $N_2$ and $CO_2$ or volatile organic liquids such as hydrogen chloride are blown under high pressure in gas or liquid form into a polymer which has been melted in a molding machine and foamed by expanding the gases contained within the polymer when the melted polymer emerges from the molding machine. A method wherein a polymer is impregnated with a suitable organic solvent and foamed by forming the impregnated polymer at a temperature equal to or higher than the boiling point of the organic solvent is also used.

The applicants have in the past studied hollow microspheres with a low dielectric constant, such as hollow microspheres made of glass, and have proposed that the microspheres be mixed into a tetrafluoroethylene resin or another fluorine-containing polymer which can be melt extruded. However, with the insulating materials described above which ave hollow microspheres mixed in, because rolling treatments are performed and the materials are subject to external forces such as compression, the hollow microspheres are easily broken. Therefore, the problem exists that electrical characteristics will fail to be enhanced even if a large number of microspheres are packed into the polymer. Other problems remain to be solved, such as the fact that the manufacture of the above materials is difficult and the products obtained are essentially limited to sheet form.

Further, in the above material which is formed in an extrusion molding device the hollow microspheres are easily broken by screw pressure in the extrusion molding device. Also adding to the fact that the melt viscosity of the filled material rises precipitously and the fluidity decreases if a large number of microspheres are packed into the polymer, the upper limit to the amount of microspheres which can be blended in remains at no more than about 10 wt %. Improvement of the electrical characteristics is thus limited.

Known fluorine-containing polymers that have been used conventionally as electrically insulating materials include polytetrafluoroethylene (PTFE), tetrafluoroethylene-hexafluoropropylene copolymers (FEP), tetrafluoroethylene-perfluoroalkylvinyl ether copolymers (PFA), poly(chlorotrifluoroethylene) (PCTFE), ethylene-tetrafluoroethylene copolymers (ETFE), and ethylene-chlorotrifluoroethylene copolymer (ECTFE). These fluorine-containing polymers are chemically stable and in general are insoluble in solvents, and hence useful molding processes for them have been compression molding and the combined use of melt molding with machining. However, because external forces such as compressive forces and shearing forces are necessarily applied to the molded material in these molding methods, when hollow microspheres of glass are packed in to the above-mentioned fluorine-containing polymers, it has not been possible to escape the breakage of the glass microspheres.

DESCRIPTION OF THE INVENTION

It has been found that a certain type of ring oxygen-containing fluorinated copolymer is ideal for the above insulating material and that the characteristics thereof, especially the mechanical strength are substantially improved by the incorporation of a certain type of fluorinated cross-linking monomer as a component.

Specifically, the insulating material of the present invention is an insulating matrix material wherein many hollow microspheres having a low dielectric constant have been adhered together by means of an amorphous ring oxygen-containing fluorinated copolymer having a low dielectric constant which is incorporated into an essentially three-dimensional network formed by means of a fluorinated cross-linking monomer, also having a low dielectric constant. Both components exhibit solubility in fluorinated organic solvents.

The ring oxygen-containing fluorinated copolymer of low dielectric constant used in the present invention to adhere the hollow microspheres is not particularly restricted as to structure so long as it is soluble in fluorinated organic solvents, such as perfluoro(2-butyltetrahydrofuran) or perfluorobenzene, and has a low dielectric contant. Representatives of such a polymer include fluorinated polymers having an oxygen ring structure as a part of the main chain, and preferably those substances among the latter which possess ether bonds in the ring structures, such as copolymer of perfluoro-2,2-dimethyl-1,3-dioxole, for example which is disclosed in U.S. Pat. No. 4,754,009 assigned to E. I. DuPont de Nemours Company, as a monomer which is copolymerized with tetrafluoroethylene, chlorotrifluoroethylene, vinylidene fluoride, hexafluoropropylene, trifluoroethylene, perfluoroalkyl vinyl ether, perfluorovinyl ether, or perfluoroalkyl ethylene, to give an amorphous copolymer. It is not clear why the above type of polymer is soluble in particular fluorine-based solvents, but it is thought that the similar ring structures of the solvents and the polymers being similar and the low crystallinity of the polymer may contribute to that solubility.

Fluorine-containing polymers containing oxygen in the chain of their structure may also be manufactured by methods including cyclization polymerization, such as shown in U.K. Patent Nos. 3,418,303 and 1,106,344, or by radical polymerization of cyclic monomers, such as disclosed in U.S. Pat. No. 3,978,030.

The use of other monomer components is in no way excluded if incorporated at a level such that the electrical properties and the solubility of the oxygen-containing polymer are not lost.

Fluorine-containing monomers, such as fluoroolefins and fluorovinyl ethers are preferred as the cross-linking copolymer component, and fluoroethylene, perfluoromethylvinyl ether, perfluoropropyl vinyl ether, or perfluorovinyl ethers containing functional groups such as carboxylic acid groups or sulfonic groups are ideal. Moreover, materials such as vinylidene fluoride, vinyl fluoride, and trichlorofluoroethylene may also be used. The compounding amount of the above cross-linking fluorine-containing polymer having a low dielectric constant, should be chosen from the range 5 to 95 wt %, preferably about 30 to 40 wt % with respect to the entire insulating material.

Further, the fluorinated cross-linking monomers are easily cross-linked via ultraviolet rays, electron rays free radical generating chemical compounds, or by other known cross-linking methods. Examples of other materials which can be added that improve the mechanical strength of the entire insulating material without impairing the electrical characteristics include cross-linking copolymer components such as acrylic acid, monofunctional acrylic acid esters, multifunctional acrylic acid esters, and fluorine-containing acrylic compounds wherein a portion of the hydrogen atoms contained in the molecular chains of the acrylic compounds are substituted by fluorine atoms. Fluorine-containing acrylic compounds of at least one of the above types can be used ideally to form two-dimensional copolymers or three dimensional copolymers. The compounding amount of the fluorine-containing cross-linking copolymer is not necessarily limited, but should be in the range of about 0.1 to 50 wt %, and preferably about 1 to 10 wt % with respect to the entire insulating material.

Specific examples of the above useful acrylic compounds which may be added to the fluorine-containing monomer include acrylic acid, 2-hydroxyethyl acrylate, 2-hydroxypropyl acrylate, isobutyl acrylate, stearyl acrylate, t-butyl acrylate, tetrahydrofurfuryl acrylate, 2-methoxyethyl acrylate, ethoxyethoxyethyl acrylate, trimethylolpropane triacrylate, pentaerythritol triacrylate, and methoxpropylene glycol acrylate. Further examples of fluorine-containing acrylic compounds other than those above include compounds with fluorine atoms substituted for the hydrogen atoms in the alkyl groups of alkyl methacrylates or alkyl acrylates.

Examples of the hollow microspheres having a low dielectric coantant which are caused to adhere and become integrated by means of the above fluorine-containing polymer and fluorine-containing cross-linking copolymer include hollow microspheres of a particle diameter in the range of about 1 to about 300 micrometers, and preferably 20 micrometers or less, which may be made of an insulating material such as a glass, a ceramic, or a plastic. Among these, hollow microspheres made of glass in which silicon dioxide is contained in an amount of 89 wt % or more are ideally used. A low dielectric constant, a low dielectric loss tangent, and a low specific gravity result from the fact that a gas such as carbon dioxide or nitrogen is enclosed within the hollow portion of the spheres. The compounding amount of said hollow microspheres is not particularly restricted, but mixing can generally be performed in the range of about 10 to 90 wt %, with 30 to 70 wt % being preferable, with respect to the entire insulating network material. The surfaces of the hollow microspheres may also be subjected to prior treatment with a coupling agent, such as a silane.

Because the fluorinated ring oxygen-containing copolymer useful in the present invention is soluble in specific fluorine-based solvents, and when hollow microspheres having a low dielectric constant are mixed into this solution, and when each copolymerization component has been added to the solution as a precursor of the final network product having a three-dimensional network cross-linked structure is applied as a coating, for example to the periphery of a conductor and the solvent is removed and curing is performed, many hollow microspheres are caused to adhere and become integrated in a cross-linked network via this fluorinated ring-oxygen containing polymer and an insulating material can be formed very simply. Because the fluorine-containing monomers used here form a three-dimensional network structure within the mass of adhered microspheres, the mechanical strength of the insulation is greatly increased, and dimensional stability and resistance to compression are especially dramatically improved.

When the insulating network material of the present invention is subjected to molding processes by means of methods such as the above, strong stress forces are not engendered during molding as they are with standard extrusion processes and the hollow microspheres contained within the material remain unbroken. A material with stable characteristics and a low dielectric constant thus results.

Because the viscosity of a solution of the fluorine-containing polymers can be easily adjusted by means of a fluorinated organic solvent, favorable handling properties are obtained even when a large number of hollow microspheres are mixed in.

EXAMPLE

The insulating network material of the present invention is described in detail with reference to an example but is not limited to the present example.

Utilizing 50 weight parts of an amorphous polymer containing fluorinated aliphatic ring oxygen-containing structures [Teflon AF2400, made by E. I. DuPont Corp.; fluorinated(ethylenic-cyclo oxoaliphatic substituted ethylenic) copolymer; dielectric constant 1.90 (100 MHz)] as the fluorine-containing polymer having a low dielectric constant, 1470 weight parts of a solution containing perfluoro(2-butyltetrahydrofuran) (Fluorinate FC-75, made by 3M Corp.) as the fluorinated solvent, and 40 weight parts of hollow microspheres made of glass (SI, made by Emerson & Cuming; dielectric constant 1.20; passed through a 20 um mesh screen) as the hollow microspheres having a low dielectric constant, the above components were stirred while being heated until the amorphous polymer was completely dissolved. Then, 10 weight parts of cross-linking copolymer containing a radical polymerization agent, such as benzoin isopropyl ether or the like (such as DEFENSA 7702, made by Dainippon Ink & Chemicals, Inc., for example) was added to this dispersion, and sufficient stirring applied to the mixture.

The resulting dispersion was coated on a polyester film, the fluorinated solvent was dried and removed, and the sample irradiated by ultraviolet light to give a completely cross-linked 3-dimensional network structure product, which was confirmed by its infrared absorption spectrum. The thickness of the film was 50 micrometer and the dielectric constant was 1.30. The mechanical strength in the form of the tensile strength, was tested and confirmed to be greatly improved in comparison with compounds that do not contain fluorinated copolymers capable of cross-linking. Further, when the film was examined by an electron microscope, absolutely no breakage of the hollow glass microspheres was observed.

Although the following was not shown in the example, the surfaces of the hollow microspheres may be treated in advance with surface treatment agents such as silane-type coupling agents. In such cases, lipophilic properties are imparted to the surfaces of the hollow microspheres and hence the affinity to adhesive fluorinated ring oxygenated polymers is increased, with great improvement of the mechanical strength.

Various additives such as antioxidants and ultraviolet light stabilizers can be added to improve the serviceability of the insulating network material of the present invention.

Two or more suitable solvents may be used in combination to improve handling properties, such as the viscosity and the driability of the solution, of the fluorinated solvent used to dissolve the fluorinated ring oxygenated polymers. Particularly when a mixed cross-linking catalyst is used, non-fluorinated organic solvents such as hydrocarbons, chlorinated hydrocarbons, and alcohols may be used in addition to combinations of fluorinated solvents.

When an insulating layer is formed using the above solution, a variety of application methods may be used, depending on the shape of the material which is to be insulated, such as roll coater methods, casting methods, and dipping methods.

In the insulating network material of the present invention, many hollow microspheres are caused to adhere and to become intregrated by means of a fluorinated ring oxygenated polymer. The coated adhered microspheres are incorporated into an essentially three-dimensional network by reaction and curing of a fluorine-containing cross-linking monomer which is soluble in fluorinated solvents. If a coating is prepared with said solution around a conductor, followed by drying and curing, a porous insulating network material containing a multiplicity of independent gas cavities, which has a high strength, can be formed simply and efficiently.

Because external forces borne by the microspheres during molding are greatly reduced as compared with the processes used in conventional methods such as extrusion molding, almost all of the microspheres remain unbroken after the molding. An insulation which has stable characteristics and a low dielectric constant is thus obtained.

Because handling properties hardly decline even when a large number of hollow microspheres are used, insulatoring network with good electrical characteristics can be formed at a lower cost than with conventional methods.

Therefore, when the insulating network of the present invention is used, a large increase in performance and considerable reduction in the cost of various electric and electronic components such as electric wires, cables, and printed circuit boards is produced.

We Claim:

1. A network comprising hollow microspheres in a matrix, said matrix comprising a mixture of:
   (a) an amorphous fluorinated ring oxygen-containing copolymer coating on and adhering to said microspheres;
   (b) a fluorinated organic solvent;
   (c) a fluorinated cross-linkable monomer; and
   (d) a cross-linking means.

2. A cross-linked and cured network of claim 1.

3. A network of claim 1 wherein said amorphous fluorinated oxygen-containing copolymer comprises copolymers of perfluoro-2,2-dimethyl-1,3-dioxle with fluorinated olefins.

4. A network of claim 3 wherein said fluorinated cross-linkable monomer is selected from the group consisting of fluoroolefins, fluorovinyl ethers, fluoroethylene, perfluoromethyl vinyl ether, perfluoropropyl vinyl ether, vinylidene fluoride, vinyl fluoride, and trichlorofluorethylene.

5. A network of claim 3 wherein said fluorinated organic solvent is selected from the group consisting essentially of perfluorobenzene a perfluoro(2-butyltetrahydrofuran).

6. A network of claim 1 containing addionally a cross-linkable acrylic monomer selected from the group consisting essentially of acrylic acid, acrylic acid esters, methacrylic acid ester, 2-hydroxyethyl acylate, 2-hydroxypropyl acrylate, isobutyl acrylate, t-butyl acrylate, stearl acrylate, tetrahydrofurfural acrylate, 2-methoxyethyl acrylate, ethoxyethoxyethyl acrylate, trimethylolpropane triacrylate, pentaerythritol triacrylate, 2-methoxypropylene glycol acrylate, fluorinated alkyl acrylates, and fluorinated alkyl methacrylates.

7. A network of claim 1 wherein the hollow microspheres comprise glass or glass containing silicon dioxide in the amount of at least 80 weight percent.

8. A network of claim 7 wherein said hollow microspheres have a particle diameter of from about 1 to about 300 micrometers, preferably about 20 micrometers or less.

9. A network of claim 7 wherein said hollow microspheres contain a gas.

10. A network of claim 9 where said gas is nitrogen or carbon dioxide.

11. A network of claim 1 wherein the cross-linking means is selected from the group radiant energy, ultraviolet light, free radical polymization agents, benzoin, benzoin ethers.

* * * * *